(12) United States Patent  
Song

(10) Patent No.: US 8,791,480 B2
(45) Date of Patent: Jul. 29, 2014

(54) LIGHT EMITTING DEVICE AND MANUFACTURING METHOD THEREOF

(75) Inventor: June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 263 days.

(21) Appl. No.: 12/934,000

(22) PCT Filed: Mar. 24, 2009

(86) PCT No.: PCT/KR2009/001500
§ 371 (c)(1),
(2), (4) Date: Nov. 17, 2010

(87) PCT Pub. No.: WO2009/120011
PCT Pub. Date: Oct. 1, 2009

(65) Prior Publication Data
US 2011/0062467 A1    Mar. 17, 2011

(30) Foreign Application Priority Data

Mar. 24, 2008 (KR) .................. 10-2008-0026843

(51) Int. Cl.
*H01L 33/22* (2010.01)
(52) U.S. Cl.
USPC ........... 257/95; 257/98; 257/94; 257/E33.074
(58) Field of Classification Search
USPC ..................... 257/13, 79–103, 918,
257/E51.018–E51.022, E33.001–E33.077, 257/E33.054, E25.028, E25.032
See application file for complete search history.

(56) References Cited

U.S. PATENT DOCUMENTS

| | | | |
|---|---|---|---|
| 6,642,549 B2 | 11/2003 | Chen et al. | |
| 2003/0218179 A1 * | 11/2003 | Koide et al. | ...................... 257/95 |
| 2004/0041157 A1 | 3/2004 | Watanabe | |
| 2005/0199887 A1 | 9/2005 | Suehiro et al. | |
| 2005/0236632 A1 | 10/2005 | Lai et al. | |
| 2006/0076565 A1 | 4/2006 | Murofushi et al. | |
| 2007/0029560 A1 | 2/2007 | Su | |
| 2008/0048206 A1 | 2/2008 | Lee et al. | |
| 2008/0265267 A1 * | 10/2008 | Unno | ............................... 257/98 |

FOREIGN PATENT DOCUMENTS

| | | |
|---|---|---|
| CN | 101027790 A | 8/2007 |
| JP | 2008-060331 A | 3/2008 |
| KR | 10-2005-0123028 A | 12/2005 |
| KR | 10-2008-0018084 A | 2/2008 |

* cited by examiner

Primary Examiner — Mamadou Diallo
(74) Attorney, Agent, or Firm — Birch, Stewart, Kolasch & Birch, LLP

(57) ABSTRACT

A light emitting device according to the embodiment includes a first conductive semiconductor layer, an active layer on the first conductive semiconductor layer, a second conductive semiconductor layer on the active layer, a current spreading layer on the second conductive semiconductor layer, a bonding layer on the current spreading layer, and a light extracting structure on the bonding layer.

18 Claims, 7 Drawing Sheets

LIGHT EMITTING DEVICE AND MANUFACTURING METHOD THEREOF

TECHNICAL FIELD

The disclosure relates to a light emitting device and a manufacturing method thereof.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED includes a first conductive semiconductor layer, an active layer and a second conductive semiconductor layer, in which the active layer generates light according to current applied to the first and second conductive semiconductor layers.

Meanwhile, the LED requires a current spreading layer to spread light over the whole area of the second conductive semiconductor layer and a light extracting structure must be formed on the current spreading layer to allow the light generated from the active layer to be emitted out of the LED without being extinguished in the LED.

However, the light extracting structure may not be easily formed on the current spreading layer and the current spreading layer may be damaged when the light extracting structure is formed on the current spreading layer.

DISCLOSURE

Technical Problem

The embodiment provides a light emitting device having a novel structure and a manufacturing method thereof.

The embodiment provides a light emitting device having a light extracting structure and a manufacturing method thereof.

The embodiment provides a light emitting device capable of improving light efficiency and a manufacturing method thereof.

Technical Solution

A light emitting device according to the embodiment may include a first conductive semiconductor layer; an active layer on the first conductive semiconductor layer; a second conductive semiconductor layer on the active layer; a current spreading layer on the second conductive semiconductor layer; a bonding layer on the current spreading layer; and a light extracting structure on the bonding layer.

A light emitting device according to the embodiment may include a first conductive semiconductor layer; an active layer on the first conductive semiconductor layer; a second conductive semiconductor layer on the active layer; a current spreading layer on the second conductive semiconductor layer; a bonding layer on the current spreading layer; a light extracting structure on the bonding layer; and a conductive via formed through the bonding layer to electrically connect the current spreading layer to the light extracting structure.

A method of manufacturing a light emitting device according to the embodiment may include the steps of forming a light emitting semiconductor layer including a first conductive semiconductor layer, an active layer and a second conductive semiconductor layer on a growth substrate and forming a current spreading layer on the light emitting semiconductor layer; forming a sacrificial separation layer on a temporary substrate and forming a light extracting layer on the sacrificial separation layer; forming a complex structure by bonding the current spreading layer with the light extracting layer after interposing a bonding layer therebetween; removing the sacrificial separation layer and the temporary substrate from the complex structure; forming a texture or a pattern on a surface of the light extracting layer; and performing an etching process such that the current spreading layer and the first conductive semiconductor layer are partially exposed, thereby forming a first electrode layer on the first conductive semiconductor layer and forming a second electrode layer on the current spreading layer.

A method of manufacturing a light emitting device according to the embodiment may include the steps of forming a light emitting semiconductor layer including a first conductive semiconductor layer, an active layer and a second conductive semiconductor layer on a growth substrate and forming a current spreading layer on the light emitting semiconductor layer; forming a sacrificial separation layer on a temporary substrate and forming a light extracting layer on the sacrificial separation layer; forming a complex structure by bonding the current spreading layer with the light extracting layer after interposing a bonding layer therebetween; removing the sacrificial separation layer and the temporary substrate from the complex structure; forming a texture or a pattern on a surface of the light extracting layer; forming a via hole passing through the light extracting layer and the bonding layer and filling the via hole with material having electric conductivity; and performing an etching process such that the first conductive semiconductor layer is partially exposed, thereby forming a first electrode layer on the first conductive semiconductor layer and forming a second electrode layer on the light extracting layer.

Advantageous Effects

The embodiment can provide a light emitting device having a novel structure and a manufacturing method thereof.

The embodiment can provide a light emitting device having a light extracting structure and a manufacturing method thereof.

The embodiment can provide a light emitting device capable of improving light efficiency and a manufacturing method thereof.

BEST MODE

[Mode for Invention]

Figure 1:
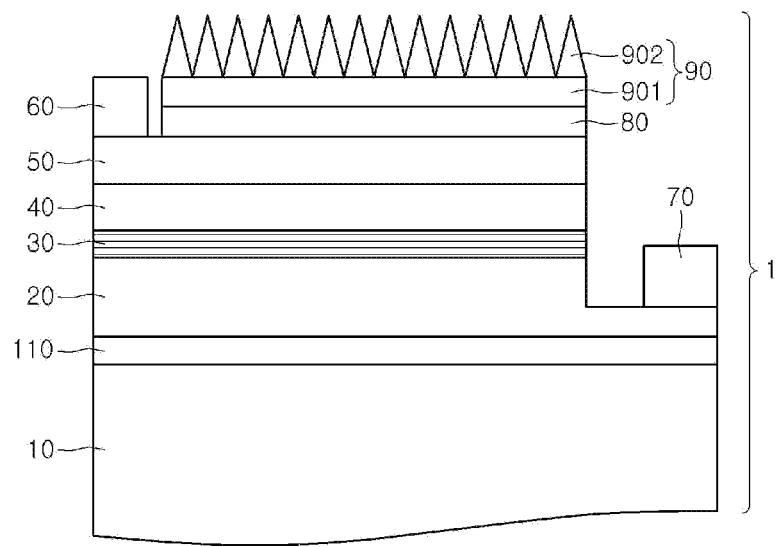
FIG. 1 is a sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device and a manufacturing method thereof according to the embodiment will be described in detail with reference to accompanying drawings.

FIG. 1 is a sectional view showing the light emitting device according to the first embodiment.

Referring to FIG. 1, the light emitting device 1 according to the first embodiment includes a growth substrate 10 formed thereon with a buffer layer 110, a first conductive semiconductor layer 20, an active layer 30, a second conductive semiconductor layer 40, a current spreading layer 50, a bonding layer 80, and a light extracting structure 90. In addition, a first electrode layer 70 is formed on the first conductive semiconductor layer 20 and a second electrode layer 60 is formed on the current spreading layer 50.

The growth substrate 10 may include sapphire or silicon carbide (SiC).

The buffer layer 110 can improve the lattice match between the growth substrate 10 and the light emitting semiconductor layer and may include AlN or GaN.

The first conductive semiconductor layer 20 may include an n type nitride-based clad layer and the second conductive semiconductor layer 40 may include a p type nitride-based clad layer. In contrast, the first conductive semiconductor layer 20 may include a p type nitride-based clad layer and the second conductive semiconductor layer 40 may include an n type nitride-based clad layer.

The first conductive semiconductor layer 20 may include material satisfying the compositional formula of $In_xAl_yGa_{(1-x-y)}N$ ($0 \leq x$, $0 \leq y$, $x+y \leq 1$) and can be formed by doping silicon.

The active layer 30 is a recombination region for electrons and holes. For instance, the active layer 30 may include one of InGaN, AlGaN, GaN, and AlInGaN. The wavelength of light emitted from the light emitting device 1 may be determined depending on the type of material used for the active layer 30.

The active layer 30 may include a multiple layer where well layers and barrier layers are repeatedly formed. The barrier layer and the well layer may include binary to quaternary nitride-based semiconductor layers expressed as $In_xAl_yGa_{(1-x-y)}N$ ($0 \leq x$, $0 \leq y$, $x+y \leq 1$). In addition, the barrier layer and the well layer may be formed by doping Si or Mg.

The second conductive semiconductor layer 40 may include material satisfying the compositional formula of $In_xAl_yGa_{(1-x-y)}N$ ($0 \leq x$, $0 \leq y$, $x+y \leq 1$) and can be formed by doping Zn or Mg.

Although not shown in the drawings, a superlattice structure, a first conductive InGaN layer, a second conductive InGaN layer or a nitride layer having a nitrogen-polar surface can be formed on the second conductive semiconductor layer 40.

The light emitting device 1 may include a stack structure, in which the first conductive semiconductor layer 20, the active layer 30 and the second conductive semiconductor layer 40 are sequentially stacked. In this case, the active layer 30 is formed on a part of the top surface of the first conductive semiconductor layer 20, and the second conductive semiconductor layer 40 is formed on the active layer 30. Thus, the part of the top surface of the first conductive semiconductor layer 20 is bonded to the active layer 30 and the remaining part of the top surface of the first conductive semiconductor layer 20 is exposed to the outside.

Meanwhile, the current spreading layer 50 is formed on a part or a whole area of the top surface of the second conductive semiconductor layer 40 to transmit the light emitted from the active layer 30 with high transmittance.

For instance, the current spreading layer 50 may include at least one of Ni—Au—O, ITO, and ZnO and make an ohmic contact with the second conductive semiconductor layer 40.

The current spreading layer 50 represents higher light transmittance of about 70% or above in the wavelength band of 600 nm or below and can be formed through PVD (physical vapor deposition) or CVD (chemical vapor deposition).

The current spreading layer 50 uniformly spreads current applied to the first and second electrode layers 70 and 60 to improve the light emitting efficiency of the light emitting device 1.

The bonding layer 80 is formed on a part of the top surface of the current spreading layer 50 and includes material having higher light transmittance to allow the light generated from the active layer 30 to be efficiently emitted to the outside.

In addition, the bonding layer 80 may bond the light extracting structure 90 to the current spreading layer 50 with higher mechanical and thermal stability.

For instance, the bonding layer 80 can be formed through the PVD or CVD by using one of $SiO_2$, $SiN_x$, $Al_2O_3$, ZnO, ZnS, $MgF_2$, and SOG (spin on glass). In addition, the bonding layer 80 may include electrical insulating material.

The light extracting structure 90 is formed on the bonding layer 80 to effectively extract the light generated from the active layer 30. In detail, the light extracting structure 90 reduces the amount of the light, which is totally reflected in the light emitting device 1 without being emitted to the outside, thereby improving the light extraction efficiency.

The light extracting structure 90 includes a first light extracting structure 901 having no surface texture or pattern and a second light extracting structure 902 formed with a surface texture or a pattern. In particular, the second light extracting structure 902 is exposed to the atmosphere and changes the incident angle of light such that a greater amount of light can be emitted to the outside.

The light extracting structure 90 may include material which can be subject to the etching. For instance, the light extracting structure 90 may include group-III nitride-based elements including GaN having the hexagonal structure or group-II oxide-based elements including ZnO having the transparent epitaxial hexagonal structure.

Preferably, the second light extracting structure 902 includes a non-metallic surface, such as an epitaxial negative polarity hexagonal surface or an epitaxial mixed polarity hexagonal surface, rather than a metallic surface, such as an epitaxial positive polarity hexagonal surface.

For instance, the second light extracting structure 902 may include the transparent epitaxial hexagonal structure, such as group-III nitride-based elements having the nitrogen polarity, or group-II oxide-based elements having the oxygen polarity, which can be easily formed with a surface texture or a pattern having a pyramidal shape in an etching solution.

In addition to the epitaxial structure, the light extracting structure 90 may include the poly-crystal transparent hexagonal structure or the amorphous transparent hexagonal structure.

The light extracting structure 90 may include the transparent hexagonal structure including dopant elements or other layers to perform the luminescent, anti-reflective or light filtering function.

The second electrode layer 60 is formed on the current spreading layer 50, which is exposed to the atmosphere, after removing a part of the bonding layer 80 and the light extracting layer 90 from the current spreading layer 50. At least a part of the second electrode layer 60 overlaps with the bonding layer 80 in the horizontal direction.

The second electrode layer 60 may include at least one of Cr, Al, Ag, Ti, Au, Pt and Pd. For instance, the second electrode layer 60 may include a metal, such as a Cr—Au alloy.

Preferably, the second electrode layer 60 forms a schottky contact or an ohmic contact with the current spreading layer 50.

If the second electrode layer 60 includes the Cr—Au alloy, the adhesion property between the second electrode layer 60 and the current spreading layer 50 can be improved and a contact interfacial surface can be formed therebetween.

The first electrode layer 70 is formed on the first conductive semiconductor layer 20. At least a part of the first electrode layer 70 overlaps with the first conductive semiconductor layer 20 in the horizontal direction.

The first electrode layer 70 may include at least one of Cr, Al, Ag, Ti, Au, Pt and Pd. For instance, the first electrode layer 70 may include a metal, such as a Cr—Al alloy.

Preferably, the first electrode layer 70 forms an ohmic contact with the first conductive semiconductor layer 20.

If the first electrode layer 70 includes the Cr—Al alloy, the adhesion property between the first electrode layer 70 and the first conductive semiconductor layer 20 can be improved and an ohmic contact interfacial surface can be formed therebetween.

Figure 2:
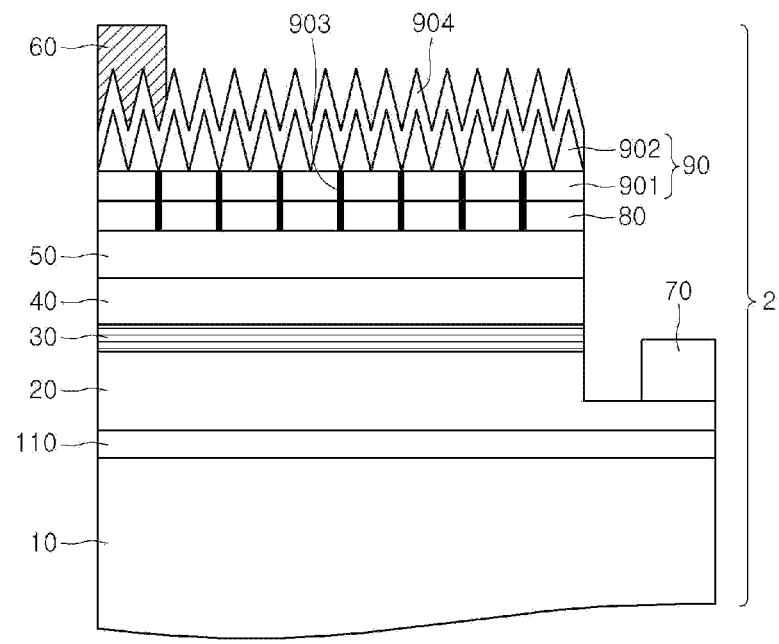
FIG. 2 is a sectional view showing a light emitting device according to the second embodiment.

FIG. 2 is a sectional view showing a light emitting device according to the second embodiment.

Referring to FIG. 2, the light emitting device 2 according to the second embodiment includes a growth substrate 10 formed thereon with a buffer layer 110, a first conductive semiconductor layer 20, an active layer 30, a second conductive semiconductor layer 40, a current spreading layer 50, a bonding layer 80, a light extracting structure 90, a conductive via 903 and a third light extracting structure 904. In addition, a first electrode layer 70 is formed on the first conductive semiconductor layer 20 and a second electrode layer 60 is formed on the third light extracting structure 904.

The growth substrate 10 may include sapphire or silicon carbide (SiC).

The buffer layer 110 can improve the lattice match between the growth substrate 10 and the light emitting semiconductor layer and may include AlN or GaN.

The first conductive semiconductor layer 20 may include an n type nitride-based clad layer and the second conductive semiconductor layer 40 may include a p type nitride-based clad layer. In contrast, the first conductive semiconductor layer 20 may include a p type nitride-based clad layer and the second conductive semiconductor layer 40 may include an n type nitride-based clad layer.

The first conductive semiconductor layer 20 may include material satisfying the compositional formula of $In_xAl_yGa_{(1-x-y)}N$ ($0 \leq x$, $0 \leq y$, $x+y \leq 1$) can be formed by doping silicon.

The active layer 30 is a recombination region for electrons and holes. For instance, the active layer 30 may include one of InGaN, AlGaN, GaN, and AlInGaN. The wavelength of light emitted from the light emitting device 2 may be determined depending on the type of material used for the active layer 30.

The active layer 30 may include a multiple layer where well layers and barrier layers are repeatedly formed. The barrier layer and the well layer may include binary to quaternary nitride-based semiconductor layers expressed as $In_xAl_yGa_{(1-x-y)}N$ ($0 \leq x$, $0 \leq y$, $x+y \leq 1$). In addition, the barrier layer and the well layer may be formed by doping Si or Mg.

The second conductive semiconductor layer 40 may include material satisfying the compositional formula of $In_xAl_yGa_{(1-x-y)}N$ ($0 \leq x$, $0 \leq y$, $x+y \leq 1$) and can be formed by doping Zn or Mg.

Although not shown in the drawings, a superlattice structure, a first conductive InGaN layer, a second conductive InGaN layer or a nitride layer having a nitrogen-polar surface can be formed on the second conductive semiconductor layer 40.

The light emitting device 2 may include a stack structure, in which the first conductive semiconductor layer 20, the active layer 30 and the second conductive semiconductor layer 40 are sequentially stacked. In this case, the active layer 30 is formed on a part of the top surface of the first conductive semiconductor layer 20, and the second conductive semiconductor layer 40 is formed on the active layer 30. Thus, the part of the top surface of the first conductive semiconductor layer 20 is bonded to the active layer 30 and the remaining part of the top surface of the first conductive semiconductor layer 20 is exposed to the outside.

Meanwhile, the current spreading layer 50 is formed over the whole area of the top surface of the second conductive semiconductor layer 40 to transmit the light emitted from the active layer 30 with high transmittance.

For instance, the current spreading layer 50 may include at least one of Ni—Au—O, ITO, and ZnO and make an ohmic contact with the second conductive semiconductor layer 40.

The current spreading layer 50 represents higher light transmittance of about 70% or above in the wavelength band of 600 nm or below and can be formed through PVD (physical vapor deposition) or CVD (chemical vapor deposition).

The current spreading layer 50 uniformly spreads current applied to the first and second electrode layers 70 and 60 to improve the light emitting efficiency of the light emitting device 2.

The bonding layer 80 is formed on the top surface of the current spreading layer 50 and includes material having higher light transmittance to allow the light generated from the active layer 30 to be efficiently emitted to the outside.

In addition, the bonding layer 80 may bond the light extracting structure 90 to the current spreading layer 50 with higher mechanical and thermal stability.

For instance, the bonding layer 80 can be formed through the PVD or CVD by using one of $SiO_2$, $SiN_x$, $Al_2O_3$, ZnO, ZnS, $MgF_2$, and SOG (spin on glass). In addition, the bonding layer 80 may include electrical insulating material.

The light extracting structure 90 is formed on the bonding layer 80 to effectively extract the light generated from the active layer 30. In detail, the light extracting structure 90 reduces the amount of the light, which is totally reflected in the light emitting device 2 without being emitted to the outside, thereby improving the light extraction efficiency.

The light extracting structure 90 includes a first light extracting structure 901 having no surface texture or pattern and a second light extracting structure 902 formed with a surface texture or a pattern. In particular, the second light extracting structure 902 is exposed to the atmosphere and changes the incident angle of light such that a greater amount of light can be emitted to the outside.

The light extracting structure 90 may include material which can be subject to the etching. For instance, the light extracting structure 90 may include group-III nitride-based elements including GaN having the hexagonal structure or group-II oxide-based elements including ZnO having the transparent epitaxial hexagonal structure.

Preferably, the second light extracting structure 902 includes a non-metallic surface, such as an epitaxial negative polarity hexagonal surface or an epitaxial mixed polarity hexagonal surface, rather than a metallic surface, such as an epitaxial positive polarity hexagonal surface.

For instance, the second light extracting structure 902 may include the transparent epitaxial hexagonal structure, such as group-III nitride-based elements having the nitrogen polarity, or group-II oxide-based elements having the oxygen polarity, which can be easily formed with a surface texture or a pattern having a pyramidal shape in an etching solution.

In addition to the epitaxial structure, the light extracting structure 90 may include the poly-crystal transparent hexagonal structure or the amorphous transparent hexagonal structure.

The light extracting structure 90 may include the transparent hexagonal structure including dopant elements or other layers to perform the luminescent, anti-reflective or light filtering function.

The conductive via 903 is formed through the bonding layer 80 to electrically connect the upper structure of the bonding layer 80 to the lower structure of the bonding layer 80. In detail, the conductive via 903 electrically connects the current spreading layer 50 to at least one of the first light extracting structure 901, the second light extracting structure 902 and the third light extracting structure 904.

The conducive via 903 can be obtained by filling a via hole formed in the bonding layer 80 and the first light extracting structure 901 with transparent material having electric conductivity, such as ITO or ZnO.

The third light extracting structure 904 is formed on the second light extracting structure 902 and includes optically transparent material having electric conductivity, such as ITO or ZnO.

The third light extracting structure 904 can be selectively omitted. In this case, the second electrode layer 60 is formed on the second light extracting structure 902.

The second electrode layer 60 is formed on the third light extracting structure 904. The second electrode layer 60 may include at least one of Cr, Al, Ag, Ti, Au, Pt and Pd. For instance, the second electrode layer 60 may include a metal, such as a Cr—Au alloy.

Preferably, the second electrode layer 60 forms a schottky contact or an ohmic contact with the third light extracting structure 904.

If the second electrode layer 60 includes the Cr—Au alloy, the adhesion property between the second electrode layer 60 and the third light extracting structure 904 can be improved and a contact interfacial surface can be formed therebetween.

The first electrode layer 70 is formed on the first conductive semiconductor layer 20. The first electrode layer 70 may include at least one of Cr, Al, Ag, Ti, Au, Pt and Pd. For instance, the first electrode layer 70 may include a metal, such as a Cr—Al alloy.

Preferably, the first electrode layer 70 forms an ohmic contact with the first conductive semiconductor layer 20.

If the first electrode layer 70 includes the Cr—Al alloy, the adhesion property between the first electrode layer 70 and the first conductive semiconductor layer 20 can be improved and an ohmic contact interfacial surface can be formed therebetween.

FIGS. 3 to 14 are views showing the procedure for manufacturing the light emitting device according to the embodiment.

Figure 3:
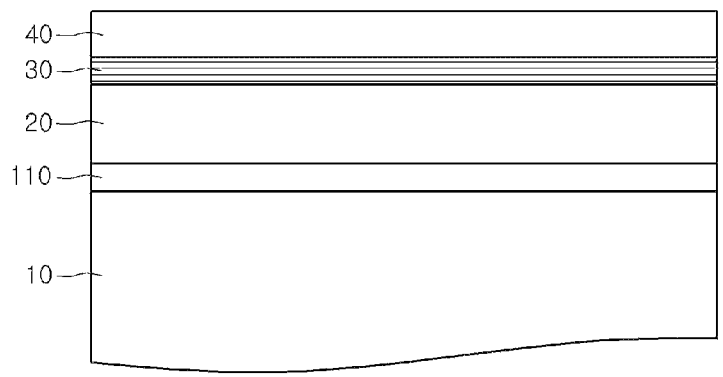
FIGS. 3 to 14 are views showing the procedure for manufacturing a light emitting device according to the embodiment.

Referring to FIG. 3, after forming the buffer layer 110 on the growth substrate 10, a light emitting semiconductor layer including the first conductive semiconductor layer 20, the active layer 30 and the second conductive semiconductor layer 40 is formed on the buffer layer 110.

The growth substrate 10 may include sapphire or silicon carbide (SiC). In addition, a patterned substrate or a corrugated substrate can be used as the growth substrate 10.

The buffer layer 110 can improve the lattice match between the growth substrate 10 and the light emitting semiconductor layer and may include AlN or GaN.

The first conductive semiconductor layer 20 may include material satisfying the compositional formula of $In_xAl_yGa_{(1-x-y)}N$ ($0 \leq x$, $0 \leq y$, $x+y \leq 1$) and can be formed by doping silicon.

The active layer 30 is a recombination region for electrons and holes. For instance, the active layer 30 may include one of InGaN, AlGaN, GaN, and AlInGaN.

The active layer 30 may include a multiple layer where well layers and barrier layers are repeatedly formed. The barrier layer and the well layer may include binary to quaternary nitride-based semiconductor layers expressed as $In_xAl_yGa_{(1-x-y)}N$ ($0 \leq x$, $0 \leq y$, $x+y \leq 1$). In addition, the barrier layer and the well layer may be formed by doping Si or Mg.

The second conductive semiconductor layer 40 may include material satisfying the compositional formula of $In_xAl_yGa_{(1-x-y)}N$ ($0 \leq x$, $0 \leq y$, $x+y \leq 1$) and can be formed by doping Zn or Mg.

Although not shown in the drawings, a superlattice structure, a first conductive InGaN layer, a second conductive InGaN layer or a nitride layer having a nitrogen-polar surface can be formed on the second conductive semiconductor layer 40.

Figure 4:

Referring to FIG. 4, the current spreading layer 50 is formed on the second conductive semiconductor layer 40.

For instance, the current spreading layer 50 may include at least one of Ni—Au—O, ITO, and ZnO and make an ohmic contact with the second conductive semiconductor layer 40.

The current spreading layer 50 represents higher light transmittance of about 70% or above in the wavelength band of 600 nm or below and can be formed through PVD (physical vapor deposition) or CVD (chemical vapor deposition).

In order to improve the electrical and optical characteristics of the current spreading layer 50, an additional annealing process can be performed after the current spreading layer 50 has been deposited on the second conductive semiconductor layer 40.

Figure 5:
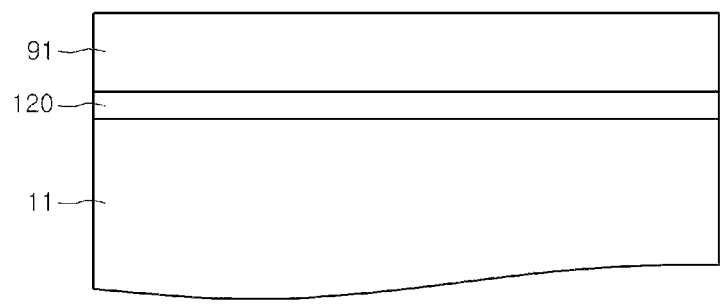

Referring to FIG. 5, a temporary substrate 11 is prepared and a sacrificial separation layer 120 and a light extracting layer 91 to form the light extracting structure are formed on the temporary substrate 11.

Preferably, the temporary substrate 11 is made from material identical to that of the growth substrate 10, but the embodiment is not limited thereto. For instance, the temporary substrate 11 may include material representing light transmittance of about 50% or above in the wavelength band of 600 nm or below, such as $Al_2O_3$, SiC, glass, AlGaN, AlN, GaN, or InGaN, or the temporary substrate 11 may include material, which can be easily etched, such as GaAs or Si.

The sacrificial separation layer 120 may include material, which can be easily lifted-off from the light extracting layer 91 through the chemical reaction in the etching solution or the chemical and thermo-chemical deposition reaction by the photo-beam.

The light extracting layer 91 is made from material which can be subject to the etching. For instance, the light extracting layer 91 may include group-III nitride-based elements including GaN having the hexagonal structure or group-II oxide-based elements including ZnO having the transparent epitaxial hexagonal structure and can be formed through MOCVD (metal organic CVD), MBE (molecular beam epitaxy), PVD or CVD.

Figure 6:
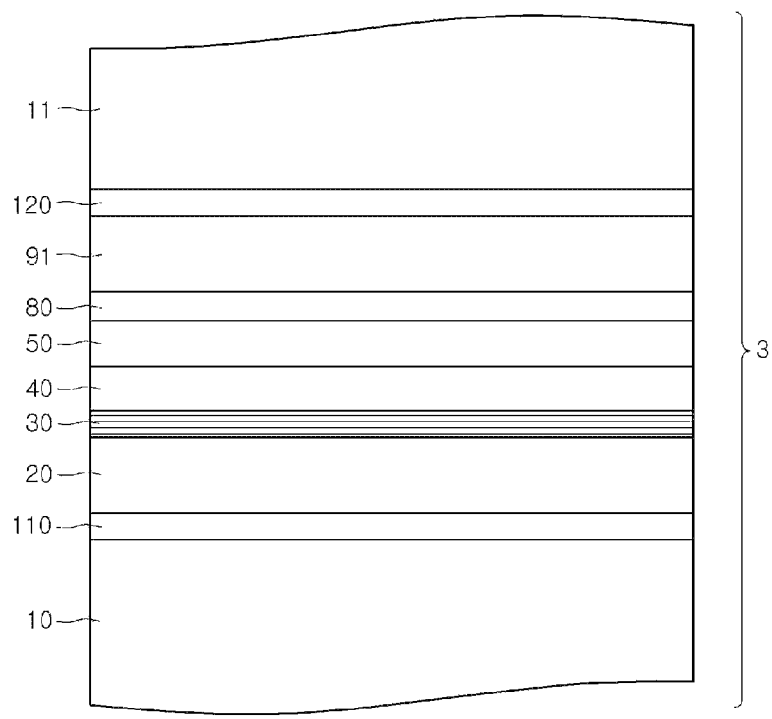

Referring to FIG. 6, a complex structure 3 is formed by bonding the structure shown in FIG. 4 with the structure shown in FIG. 5 using the bonding layer 80.

In detail, the current spreading layer 50 and the light extracting layer 91 are bonded to each other by the bonding layer 80 interposed between the current spreading layer 50 and the light extracting layer 91, thereby forming the complex structure 3.

The bonding layer 80 is disposed between the current spreading layer 50 and the light extracting layer 91 in order to bond the light extracting layer 91 to the current spreading layer 50 with higher mechanical and thermal stability. For instance, the bonding layer 80 can be formed through the PVD or CVD by using electrical insulating material, such as $SiN_x$, $Al_2O_3$, ZnO, ZnS, $MgF_2$, or SOG (spin on glass).

Before the complex structure 3 is formed, the isolation etching process may be performed with respect to the structure formed on the growth substrate 10 and the structure formed on the temporary substrate 11 to obtain unit devices having the predetermined dimension and shape.

Figure 7:
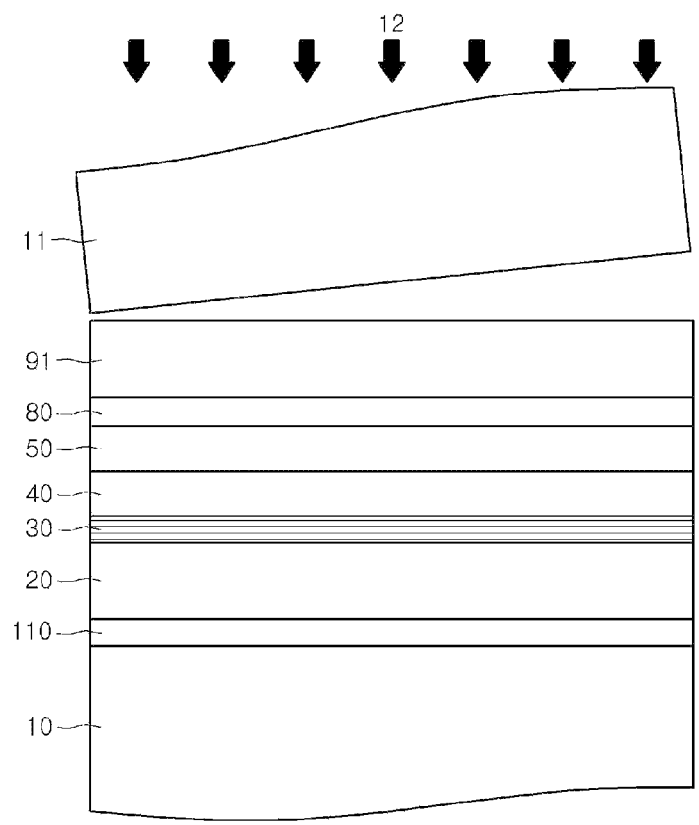
Figure 8:
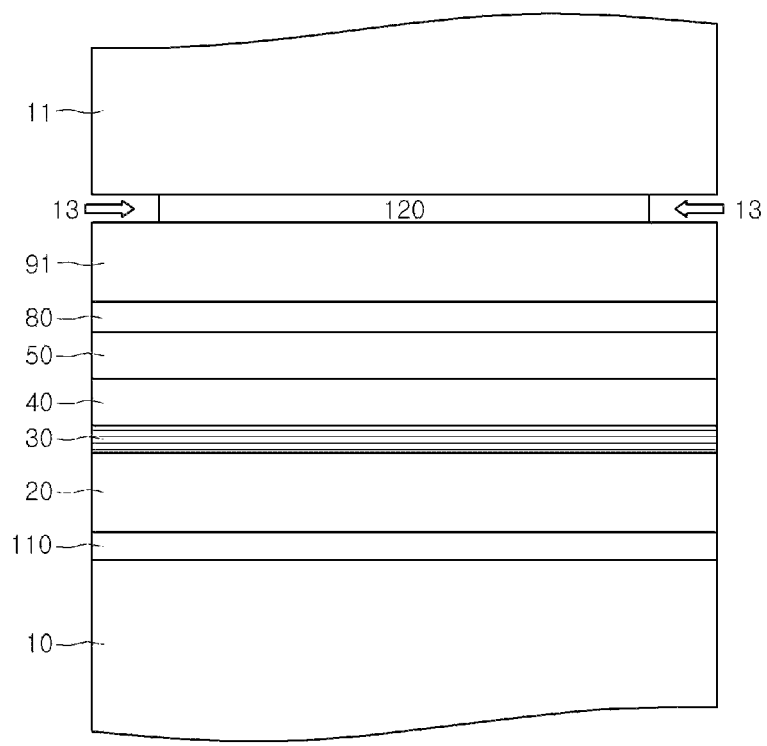

Referring to FIGS. 7 and 8, the temporary substrate 11 is separated from the complex structure 3 shown in FIG. 6. FIGS. 7 and 8 show methods for separating the temporary substrate 11, respectively.

First, as shown in FIG. 7, a photon-beam 12 is irradiated onto the backside of the temporary substrate 11 to remove the sacrificial separation layer through the thermo-chemical decomposition reaction, thereby separating the temporary substrate 11.

The photon-beam 12 has a predetermined wavelength and is transmitted through the temporary substrate 11. The photon-beam 12 is strongly absorbed in the sacrificial separation layer while generating high-temperature heat, thereby decomposing materials constituting the sacrificial separation layer.

In addition, as shown in FIG. 8, the temporary substrate 11 can be separated by selectively removing the sacrificial separation layer 120 through the chemical decomposition reaction using the etching solution 13.

Although not shown in the drawings, the temporary substrate 11 can be removed through the polishing process or the chemical mechanical polishing (CMP) process.

Figure 9:
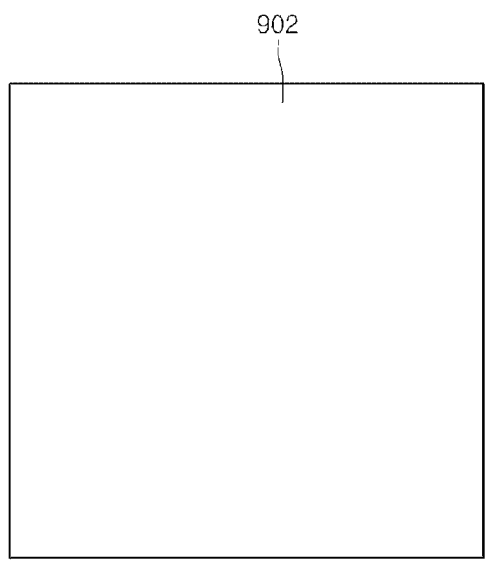

Referring to FIG. 9, the light extracting layer 91 is exposed as the temporary substrate 11 has been separated, and the surface texture or the pattern is formed on the surface of the light extracting layer 91, thereby forming the second light extracting structure 902.

Figure 10:
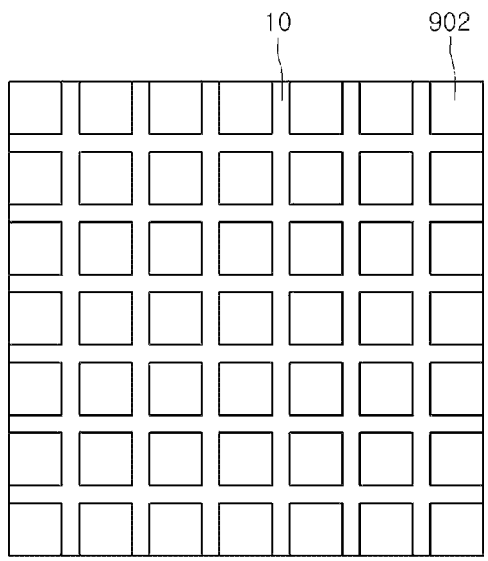

Referring to FIG. 10, the isolation etching process is performed to selectively remove the resultant structure from the second light extracting structure 902 to the buffer layer 110, thereby exposing the growth substrate 10.

As shown In FIG. 10, the structure shown in FIG. 9 is divided into unit devices having the predetermined dimension and shape through the isolation etching process.

Meanwhile, as described above, the isolation etching process can be performed before the complex structure 3 is formed.

Figure 11:
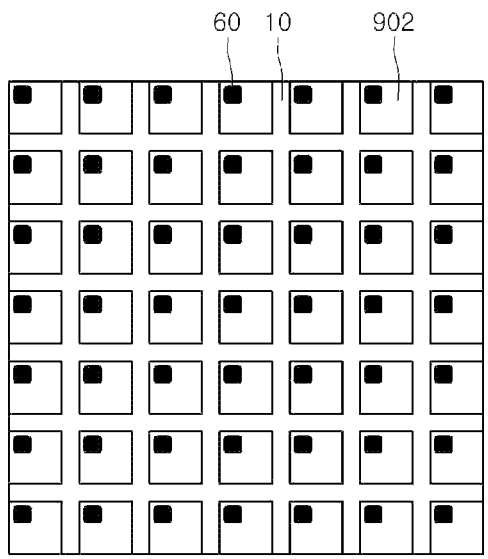
Figure 12:
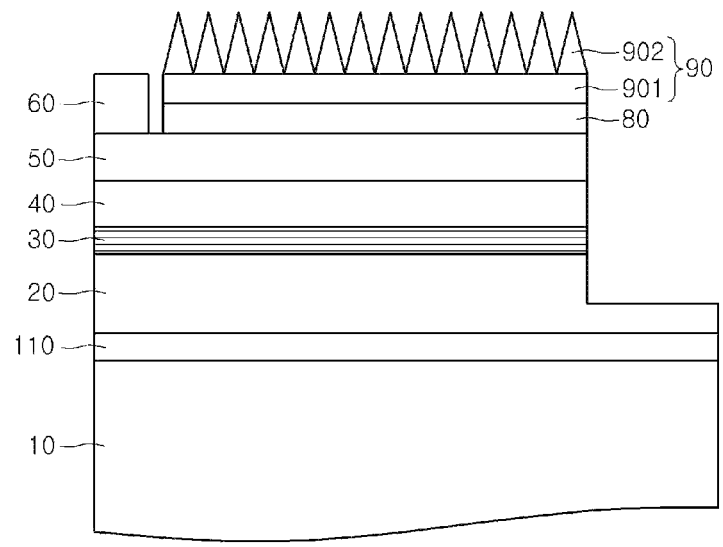

Referring to FIGS. 11 and 12, the etching process is performed such that the current spreading layer 50 and the first conductive semiconductor layer 20 can be partially exposed and then the second electrode layer 60 is formed on the current spreading layer 50.

Figure 13:
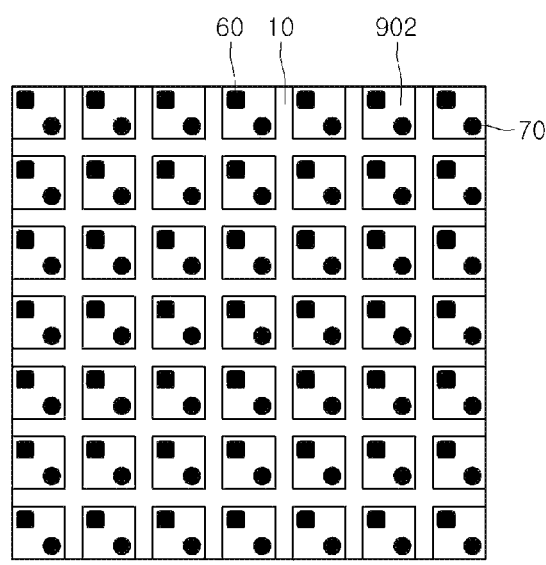
Figure 14:
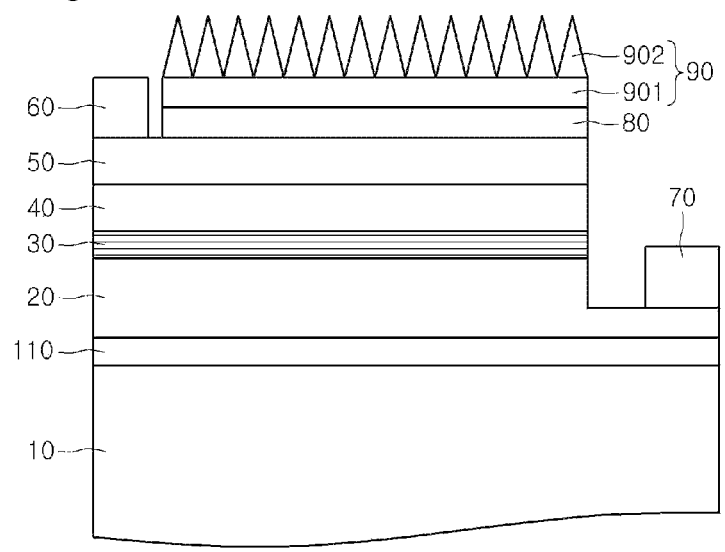

Referring to FIGS. 13 and 14, the first electrode layer 70 is formed on the first conductive semiconductor layer 20.

For reference, FIGS. 12 and 14 show the sectional shape of the unit device which is obtained through the isolation etching process.

In this manner, the light emitting device 1 according to the first embodiment can be manufactured.

The method of manufacturing the light emitting device 2 according to the second embodiment is similar to that of the first embodiment explained with reference to FIGS. 3 to 14.

However, according to the second embodiment, in the process step corresponding to FIG. 9 of the first embodiment, the via hole is formed through the first light extracting structure 901 and the bonding layer 80 and material having electric conductivity is filled in the via hole to form the conductive via 901.

In addition, in the process step corresponding to FIGS. 11 to 14 of the first embodiment, the third light extracting structure 904 is formed on the second light extracting structure 902 and the etching process is performed to partially expose the first conductive semiconductor layer 20. Then, the second electrode layer 60 is formed on the third light extracting structure 904 and the first electrode layer is formed on the first conductive semiconductor layer 20.

In this manner, the light emitting device 2 according to the second embodiment can be manufactured.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments are applicable for the light emitting device including the light emitting diode.

The invention claimed is:

1. A light emitting device comprising:
a first conductive semiconductor layer;
an active layer on the first conductive semiconductor layer;
a second conductive semiconductor layer on the active layer;
a current spreading layer on the second conductive semiconductor layer;
a bonding layer on the current spreading layer;
a second electrode layer on the current spreading layer; and
a light extracting structure on the bonding layer,
wherein the current spreading layer forms an ohmic contact with the second conductive semiconductor layer and the second electrode layer forms a schottky contact with the current spreading layer.

2. The light emitting device of claim 1, further comprising a buffer layer and a growth substrate under the first conductive semiconductor layer.

3. The light emitting device of claim 1, further comprising a first electrode layer on the first conductive semiconductor layer, wherein at least a part of the first electrode layer overlaps with the first conductive semiconductor layer in a horizontal direction.

4. The light emitting device of claim 1, wherein at least a part of the second electrode layer overlaps with the bonding layer in a horizontal direction.

5. The light emitting device of claim 1, wherein the bonding layer includes electrical insulating material.

6. The light emitting device of claim 5, wherein the bonding layer includes one selected from the group consisting of $SiO_2$, $SiN_x$, $Al_2O_3$, ZnO, ZnS, $MgF_2$, and SOG (spin on glass).

7. The light emitting device of claim 1, wherein the light extracting structure is formed with a surface texture or a pattern, and includes an epitaxial negative polarity hexagonal surface or an epitaxial mixed polarity hexagonal surface.

8. The light emitting device of claim 1, wherein the light extracting structure includes group-III nitride-based elements having nitrogen polarity or group-II oxide-based elements having oxygen polarity.

9. The light emitting device of claim 1, wherein the current spreading layer includes at least one of Ni—Au—O, ITO, and ZnO.

10. The light emitting device of claim 1, wherein the second electrode layer and the bonding layer are separated from each other.

11. The light emitting device of claim 1, wherein the second electrode layer and the light extracting structure are separated from each other.

12. A light emitting device comprising:
a first conductive semiconductor layer;
an active layer on the first conductive semiconductor layer;
a second conductive semiconductor layer on the active layer;
a current spreading layer on the second conductive semiconductor layer;
a bonding layer on the current spreading layer;
a light extracting structure on the bonding layer; and
a conductive via formed through the bonding layer to electrically connect the current spreading layer to the light extracting structure.

13. The light emitting device of claim 12, further comprising a buffer layer and a growth substrate under the first conductive semiconductor layer.

14. The light emitting device of claim 12, further comprising a first electrode layer on the first conductive semiconductor layer and a second electrode layer on the light extracting structure.

15. The light emitting device of claim 12, wherein the bonding layer includes electrical insulating material.

16. The light emitting device of claim 12, wherein the current spreading layer includes at least one of Ni—Au—O, ITO, and ZnO.

17. The light emitting device of claim 12, wherein the bonding layer includes one selected from the group consisting of $SiO_2$, $SiN_x$, $Al_2O_3$, ZnO, ZnS, $MgF_2$, and SOG (spin on glass).

18. The light emitting device of claim 14, further comprising a transparent material between the second electrode layer and the light extracting structure,
wherein the transparent material includes ITO or ZnO.

* * * * *